United States Patent [19]

Munger et al.

[11] 4,415,649

[45] Nov. 15, 1983

[54] FLEXOGRAPHIC PRINTING PLATES CONTAINING BLENDED ADHESIVES

[75] Inventors: Stanley H. Munger, Rumson; Michael R. Short, Freehold; David W. Swatton, East Keansburg, all of N.J.

[73] Assignee: E. I. Du Pont de Nemours & Co., Wilmington, Del.

[21] Appl. No.: 384,558

[22] Filed: Jun. 3, 1982

Related U.S. Application Data

[63] Continuation-in-part of Ser. No. 237,861, Feb. 25, 1981, abandoned.

[51] Int. Cl.$^3$ .............................................. G03C 1/78
[52] U.S. Cl. ................................... 430/271; 430/286; 430/302; 430/905; 428/355
[58] Field of Search ................... 430/271, 271 A, 281, 430/286, 302, 905; 428/355

[56] References Cited

U.S. PATENT DOCUMENTS

| | | | |
|---|---|---|---|
| 3,948,666 | 4/1976 | Kitanishi et al. | 96/115 P |
| 3,990,897 | 11/1976 | Zuerger et al. | 96/67 |
| 4,060,656 | 11/1977 | Naka et al. | 428/355 |
| 4,177,074 | 12/1979 | Proskow | 430/286 |
| 4,197,125 | 4/1980 | Ohkawa et al. | 430/306 |

*Primary Examiner*—Jack P. Brammer

[57] ABSTRACT

Photosensitive flexographic element comprising
(A) a flexible support,
(B) a photosensitive elastomeric layer comprising (a) butadiene/acrylonitrile copolymer having a no. average molecular weight of 20,000 to 75,000 and optionally up to 15% by weight carboxyl content, (b) ethylenically unsaturated monomer and (c) free radical generating system, and between (A) and (B) an adhesive blend of at least two of the following polymers (1) polyester resin, condensation polymer of ethylene glycol, terephthalic acid, isophthalic acid and azelaic acid, 0 to 78% by weight; (2) polyether polyurethane resin having a Brookfield viscosity of 100–1200, 0 to 78% by weight; (3) a polyamide as defined, 0 to 94% by weight; and (4) a polyamide as defined, 0 to 97% by weight, the weight percentages based on the total weight of resin in the adhesive composition. The element is particularly useful for the preparation of flexographic printing plates processed in aqueous or semiaqueous basic solutions.

19 Claims, No Drawings

FLEXOGRAPHIC PRINTING PLATES CONTAINING BLENDED ADHESIVES

CROSS REFERENCE TO RELATED APPLICATIONS

This is a continuation-in-part of application Ser. No. 237,861, filed Feb. 25, 1981, now abandoned.

TECHNICAL FIELD

This invention relates to photosensitive flexographic elements. More particularly this invention relates to photosensitive flexographic elements wherein the photosensitive layer is bonded to the support by an adhesive blend.

BACKGROUND ART

Photosensitive flexographic printing plates are becoming more important in the printing trade. Particularly useful compositions for preparing such flexographic printing plates contain butadiene/acrylonitrile polymers with optional carboxyl groups, addition polymerizable ethylenically unsaturated compounds, and photoinitiators. The composition is formed into a layer and is generally laminated to a flexible support. It has been found that the adhesion of the photosensitive layer to the support is inadequate unless an adhesive composition is used to bond the layer to the support. Proskow U.S. Pat. No. 4,177,074 which relates to photosensitive, flexographic layers, discloses in column 9, line 10 to 16, that known adhesive compositions can be used to give strong adherence. Other known adhesives are those of the polyester type which can be used with curing agents such as isocyanates. These adhesives, while providing improved bonding between the photosensitive layer and the support, are not up to the desired standard under all conditions. The polyester adhesive containing the isocyanate curing agent must be brought into contact with the photosensitive layer almost immediately after preparation or an inferior bond will result due to premature curing of this adhesive. Adhesive blends are known to be useful in printing plates to bond the photosensitive layer to the support. It is not known, however, that adhesive blends have been used previously in flexographic printing plates.

It is an object of this invention that a photosensitive flexographic element be provided that possesses excellent adhesion between the photosensitive layer and the support. Another object is to provide such adhesion at normal ambient conditions using an adhesive blend without the necessity of a curing step.

DISCLOSURE OF THE INVENTION

In accordance with this invention there is provided a photosensitive flexographic element which comprises
  (A) a flexible support and
  (B) a layer of a photosensitive, elastomeric composition which comprises, based on the total weight of composition
    (a) 55 to 90% by weight of a high molecular weight butadiene/acrylonitrile copolymer having a number average molecular weight of 20,000 to 75,000, an acrylonitrile content of 10 to 50% by weight and a carboxyl content of 0 to 15% by weight,
    (b) 2 to 40% by weight of a nongaseous, ethylenically unsaturated compound containing at least one terminal ethylenic group, said compound being capable of forming a high polymer by free-radical initiated, chain-propagating addition polymerization; and being compatible with polymer (a); and
    (c) 0.001 to 10% by weight of an organic, radiation-sensitive, free-radical generating system, activatable by actinic radiation which initiates polymerization of the unsaturated compound;

and between layers (A) and (B) a layer of an adhesive composition which comprises a blend of at least two polymers taken from the group consisting of
  (1) polyester resin which is a condensation polymer of ethylene glycol, terephthalic acid, isophthalic acid and azelaic acid in a molar ratio of about 6:2:1:3, the resin having a number average molecular weight of about 19,000 and a weight average molecular weight of about 37,000, 0 to 78% by weight based on the total weight of resin in the adhesive composition;
  (2) polyether polyurethane resin which is a crystalline, thermoplastic resin having a Brookfield viscosity of 100–1200 centipoises using 15% by weight solids in methyl ethyl ketone and a Brookfield spindle #3 at 12 rpm, and an adhesive activation temperature in the range of 54° to 63° C., 0 to 78% by weight based on the total weight of resin in the adhesive composition,
  (3) polyamide which is a thermoplastic dimer acid polyamide resin having a Ball and Ring softening point of 132°–145° C., a viscosity at 210° C. of 40 to 60 poises, % elongation determined by ASTM D-1708 of 130 at −18° C., 560 at 24° C. and 100 at 60° C., tensile break determined by ASTM D-1708 of 4000 psi at −18° C., 450 psi at 24° C. and 170 psi at 60° C., 0 to 94% by weight based on the total weight of resin in the adhesive composition, and
  (4) polyamide which is a thermoplastic dimer acid polyamide resin having a Ball and Ring softening point of 150°–160° C., a viscosity at 210° C. of 28 to 38 poises, % elongation determined by ASTM D-1708 of 350 at −18° C., 250 at 24° C. and 40 at 60° C., tensile break determined by ASTM D-1708 of 2200 psi at −18° C., 360 psi at 24° C. and 50 psi at 60° C., 0 to 97% by weight based on the total weight of resin in the adhesive composition.

The photosensitive compositions utilized in the elements of this invention are adhered to flexible supports, i.e., supports taken from the group consisting of plastic films and metal. Examples of such supports include: polymeric film supports such as polyethylene terephthalate, flame-treated polyethylene terephthalate, electron-discharge treated polyethylene terephthalate, polyimide, e.g., film as disclosed in U.S. Pat. No. 3,179,634 which is incorporated by reference, etc., and thin metal supports such as aluminum, tin-plated steel (dull or shiny). The polymeric supports generally have a thickness in the range of 0.001 inch to 0.007 inch (0.025 to 0.18 mm). The metal supports generally have a thickness in the range of 0.010 to 0.0115 inch (0.25 to 0.29 mm) for aluminum and 0.008 to 0.010 inch (0.20 to 0.25 mm) for tin plated steel. The photosensitive compositions disclosed herein are developable in their unexposed state in aqueous, semiaqueous basic, or solvent solutions depending on the carboxyl content of the polymeric binder component of the photosensitive composition. The photosensitive layers are in the thickness range of 0.005 to 0.250 inch (about 0.013 to 6.35 mm) or more.

One essential ingredient of the photosensitive, elastomeric composition is a high molecular weight butadiene/acrylonitrile copolymer (a) having a number average molecular weight ($\overline{Mn}$) in the range of about 20,000 to about 75,000, preferably in the range of about 25,000 to about 50,000. The $\overline{Mn}$ for the polymers described herein can be determined by gel permeation chromatography employing a polybutadiene standard. The acrylonitrile content of the polymers varies from about 10 to about 50% by weight, preferably from about 15 to about 40%. Optionally, the copolymer also has a carboxyl content of 0 to about 15% by weight. When the copolymer contains carboxyl groups, the carboxyl content is preferably in the range of about 1 to about 15%, most preferably in the range of about 2 to about 10% by weight. The copolymer is present in an amount of about 55 to 90% by weight, based on the total weight of the composition, and preferably about 60 to about 75% by weight. At least about 55% by weight of the copolymer is necessary to give adequate flexibility and physical integrity to the photosensitive elements, particularly for flexographic plates.

Carboxyl groups may be incorporated into the high molecular weight copolymer by addition to the polymerization process of a carboxyl containing monomer, e.g., acrylic or methacrylic acid, or a monomer which is convertible to a carboxyl containing group, e.g., maleic anhydride or methyl methacrylate. Such polymers are available commercially from several sources, e.g., from the B. F. Goodrich Chemical Company under the trade name Hycar ®.

Another essential ingredient of the photosensitive compositions of this invention is a nongaseous, ethylenically unsaturated compound containing at least one terminal ethylenic group (b). This compound should be capable of forming a high polymer by free-radical initiated chain-propagating addition polymerization and be compatible with the high molecular weight polymers (a) described above. One class of suitable ethylenically unsaturated compounds includes unsaturated esters of alcohols, especially such esters of alpha-methylene carboxylic acids and substituted alpha-methylene carboxylic acids, more especially such esters of alkylene polyols and polyalkylene polyols, and most especially alkylene polyol di- and tri-acrylates and polyalkylene polyol di- and tri-acrylates prepared from alkylene polyols of 2–15 carbon atoms or polyalkylene ether polyols or glycols of 1–10 ether linkages.

The following specific compounds are further illustrative of this class: ethylene glycol diacrylate, diethylene glycol diacrylate, glycerol diacrylate, glycerol triacrylate, trimethylolpropane triacrylate, ethylene glycol dimethacrylate, 1,3-propanediol dimethacrylate, 1,2,4-butanetriol trimethacrylate, 1,4-cyclohexanediol diacrylate, 1,4-benzenediol dimethacrylate, 1,2-benzenedimethanol diacrylate, pentaerythritol triacrylate, pentaerythritol tetramethacrylate, 1,3-propanediol diacrylate, 1,3-pentanediol dimethacrylate, p-alpha, alpha-dimethylbenzylphenyl acrylate, t-butyl acrylate, N,N-diethylaminoethyl acrylate, diethylaminoethyl methacrylate, 1,4-butanediol diacrylate, hexamethylene glycol diacrylate, decamethylene glycol diacrylate, 2,2-dimethylolpropane diacrylate, tripropylene glycol diacrylate, 2,2-di(p-hydroxy-phenyl)propane, 2,2-di(dihydroxyphenyl)propane dimethacrylate, polyoxyethyl-2,2-di(p-hydroxyphenyl)propane triacrylate (molecular weight of 462), 1,4-butanediol dimethacrylate, hexamethylene glycol dimethacrylate, 2,2,4-trimethyl-1,3-pentanediol dimethacrylate, 1-phenylethylene-1,2-dimethacrylate, trimethylolpropane trimethacrylate, triethylene glycol diacrylate, ethylene glycol acrylate phthalate, polyoxyethyltrimethylolpropane triacrylate, diacrylate and dimethacrylate esters of diepoxy polyethers derived from aromatic polyhydroxy compounds such as bisphenols, novolaks and similar compounds such as those described by Crary in U.S. Pat. No. 3,661,576, which is incorporated by reference, the bisacrylates and methacrylates of polyethylene glycols of molecular weight 200–500, etc.

Another class of suitable ethylenically unsaturated compounds includes the compounds disclosed by Martin and Barney in U.S. Pat. No. 2,927,022 which is incorporated by reference, e.g., those having a plurality of addition polymerizable ethylenic linkages, particularly when present as terminal linkages, and especially those wherein at least one and preferably most of such linkages are conjugated with a double bonded carbon, including carbon double bonded to carbon and to heteroatoms such as nitrogen, oxygen and sulfur. Preferred are such materials wherein the ethylenically unsaturated groups, especially the vinylidene groups, are conjugated with ester or amide structures. Specific examples of such compounds include unsaturated amides, particularly those of alpha-methylene carboxylic acids, especially with alpha-omega-diamines and oxygen-interrupted omega-diamines, such as methylene bis-acrylamide, methylene bis-methacrylamide, ethylene bis-methacrylamide, 1,6-hexamethylene-bis-acrylamide, diethylene triamine trismethacrylamide, bis(methacrylamidopropoxy)ethane, betamethacrylamidoethyl methacrylate, N-(beta-hydroxyethyl)-beta-(methacrylamido)ethyl acrylate, and N,N-bis(beta-methacryloxyethyl) acrylamide; vinyl esters such as divinyl succinate, divinyl adipate, divinyl phthalate, divinyl terephthalate, divinyl benzene-1,3-disulfonate, and divinyl butane-1,4-disulfonate; diallyl fumarate; etc.

Additional ethylenically unsaturated compounds which may be used include styrene and derivatives thereof: 1,4-diisopropenylbenzene, 1,3,5-triisopropenylbenzene; itaconic anhydride adducts with hydroxyethyl acrylate (1:1), itaconic anhydride adducts with liquid butadiene/acrylonitrile polymers containing terminal amino groups, and itaconic anhydride adducts with the diacrylate and dimethacrylate esters of diepoxy polyethers described in Crary U.S. Pat. No. 3,661,576; polybutadiene and butadiene/acrylonitrile copolymers containing terminal and pendant vinyl groups; and unsaturated aldehydes, such as sorbaldehyde (2,4-hexadienal).

Ethylenically unsaturated compounds which are water soluble or contain carboxyl or other alkali-reactive groups are especially suitable when aqueous basic-developable systems are involved. In addition, the polymerizable, ethylenically unsaturated polymers of Burg, U.S. Pat. No. 3,043,805; Martin, U.S. Pat. No. 2,929,710; and similar materials may be used alone or mixed with other materials. Acrylic and methacrylic esters of adducts of ethylene oxide and polyhydroxy compounds such as those described by Cohen and Schoenthaler in U.S. Pat. No. 3,380,831 are also useful. The photocrosslinkable polymers disclosed in Schoenthaler, U.S. Pat. No. 3,418,295, and Celeste, U.S. Pat. No. 3,448,089, may also be used. All of these patents are incorporated by reference.

The amount of unsaturated compound added should be in the range of about 2 to about 40% by weight, based on the total weight of composition. The specific amount for optimum results will vary depending on the particular polymers used. Preferably the amount of unsaturated compound is in the range of about 5 to about 25%.

The ethylenically unsaturated compound preferably has a boiling point at normal pressure of over about 100° C. The most preferred ethylenically unsaturated compounds are triethylene glycol diacrylate, triethylene glycol dimethacrylate, hexamethylene glycol dimethacrylate and hexamethylene glycol diacrylate.

The photosensitive compositions of this invention substantially do not scatter actinic radiation when in the form of thin layers, as described above. In order to secure a substantially transparent mixture, i.e., a non-radiation-scattering mixture, the butadiene copolymer and polymer components should be compatible with, and preferably soluble in, the ethylenically unsaturated compound in the proportions used.

By "compatible" is meant the ability of two or more constituents to remain dispersed in one another without causing any significant amount of scattering of actinic radiation. Compatibility is often limited by the relative proportions of the constituents, and incompatibility is evidenced by formation of haze in the photosensitive composition. Some slight haze can be tolerated from such compositions before or during exposure in the preparation of printing reliefs, but when fine detail is desired, haze should be completely avoided. The amount of ethylenically unsaturated compound, or any other constituent, used is therefore limited to those concentrations which do not produce undesired light scatter or haze.

Another essential ingredient of the photosensitive compositions of this invention is an organic, radiation-sensitive, free-radical generating system (c). Practically any organic, radiation-sensitive, free-radical generating system which initiates polymerization of the unsaturated compound and does not excessively terminate the polymerization can be used in the photosensitive compositions of this invention. The term "organic" is used here and in the claims to designate compounds which contain carbon, and one or more of oxygen, hydrogen, nitrogen, sulfur and halogen, but no metal. Because process transparencies transmit heat originating from conventional sources of actinic radiation, and since the photosensitive compositions are usually prepared under conditions resulting in elevated temperatures, the preferred free-radial generating compounds are inactive thermally below 85° C. and more preferably below 185° C. They should be dispersible in the composition to the extent necessary for initiating the desired polymerization or crosslinking under the influence of the amount of radiation absorbed in relatively short term exposures. These initiators are useful in amounts from about 0.001 to about 10% by weight, and preferably from about 0.1 to about 5% based on the total weight of the solvent-free photosensitive composition.

The free-radical generating system absorbs radiation within the range of about 2000 to about 8000 Å and has at least one component that has an active radiation absorption band with molar extinction coefficient of at least about 50 within the range of about 2500 to about 8000 Å, and preferably about 2500 to about 5000 Å. The term "active radiation absorption band" means a band of radiation which is active to produce the free radicals necessary to initiate polymerization or crosslinking of the unsaturated material.

The free-radical generating system can comprise one or more compounds which directly furnish free radicals when activated by radiation. It can also comprise a plurality of compounds, one of which yields the free radicals after having been caused to do so by a sensitizer which is activated by the radiation.

A large number of such free-radical generating compounds can be utilized in the practice of the invention and include aromatic ketones such as benzophenone, Michler's ketone [4,4'-bis(dimethylamino)benzophenone], 4,4'-bis(diethylamino)benzophenone, 4-acryloxy-4'-dimethylaminobenzophenone, 4-acryloxy-4'-diethylamonobenzophenone, 4-methoxy-4'-dimethylaminobenzophenone, 2-phenyl-2,2-dimethoxyacetophenone, 2-ethylanthraquinone, phenanthraquinone, 2-t-butylanthraquinone, 1,2-benzanthraquinone, 2,3-benzathraquinone, 2,3-dichloronaphthoquinone, benzil dimethyl acetal, and other aromatic ketones; benzoin, benzoin ethers such as benzoin methyl ether, benzoin ethyl ether, benzoin isobutyl ether, and benzoin phenyl ether, methylbenzoin, ethylbenzoin and other benzoins; and 2,4,5-triarylimidazolyl dimers such as 2-(o-chlorophenyl)-4,5-diphenylimidazolyl dimer, 2-(o-chlorophenyl-4,5-di(m-methoxyphenyl)imidazolyl dimer, 2-(o-fluorophenyl)-4,5-diphenylimidazolyl dimer, 2-(o-methoxyphenyl(-4,5-diphenylimidazoly dimer, 2-(p-methoxyphenyl(-4,5-diphenylimidazoly dimer, 2,4-di(p-methoxyphenyl)-5-phenylimidazolyl dimer, 2-(2,4-dimethoxyphenyl)-4,5-diphenylimidazolyl dimer, 2-(p-methylmercaptophenyl)-4,5-diphenylimidazolyl dimer, etc., as disclosed in U.S. Pat. Nos. 3,479,185 and 3,784,557 and in British Pat. Nos. 997,396 and 1,047,569. These patents are incorporated herein by reference.

The imidazolyl dimers can be used with a free-radical producing electron donor such as 2-mercaptobenzoxazole, Leuco Crystal Violet or tri(4-diethylamino-2-methylphenyl)methane. Such sensitizers as Michler's ketone may be added. Various energy transfer dyes such as Rose Bengal and Eosin Y can also be used. Additional examples of suitable initiators are disclosed by Plambeck in U.S. Pat. No. 2,760,863 which is incorporated by reference.

The photosensitive compositions may also contain a small amount of thermal addition polymerization inhibitor, e.g., 0.001% to 2.0%, based on the weight of the total solvent-free photosensitive composition. Suitable inhibitors include hydroquinone and alkyl and aryl-substituted hydroquinones, 2,6-di-tert-butyl-4-methylphenol, p-methoxyphenol, tert-butylpyrocatechol, pyrogallol, beta-naphthol, 2,6-di-tert-butyl-p-cresol, phenothiazine, pyridine, nitrobenzene, dinitrobenzene and the nitroso dimer inhibitor systems described in U.S. Pat. No. 4,168,982 which is incorporated by reference. Other useful inhibitors include p-toluquinone, chloranil and thiazine dyes, e.g., Thionine Blue G (CI 52025), Methylene Blue B (CI 52015) and Toluidine Blue (CI 52040). Such compositions can be photopolymerized or photocrosslinked without removal of the inhibitor. The preferred inhibitors are 2,6-di-tert-butyl-4-methylphenol and p-methoxyphenol.

The oxygen and ozone resistance of photosensitive elements of this invention and printing reliefs made therefrom can be improved by incorporating into the photosensitive composition a suitable amount of compatible well known antioxidants and/or antiozonants. Antioxidants useful in this invention include: alkylated phenols, e.g., 2,6-di-tert-butyl-4-methylphenol; alkylated bis-phenols, e.g., 2,2-methylene-bis-(4-methyl-6-tert-butylphenol); 1,3.5-trimethyl-2,4,6-tris-(3,5-di-tert-butyl-4-hydroxybenzyl)benzene; 2-(4-hydroxy-3,5-di-tert-butylanilino)-4,6-bis-(n-octyl thio)-1,3,5-triazine;

polymerized trimethyldihydroquinone; and dilauryl thiopropionate.

Antiozonants useful in this invention include: microcrystalline wax and paraffin wax; dibutylthiourea; 1,1,3,3-tetramethyl-2-thiourea; Antiozonant AFD, a product of Nafton Co.; norbornenes, e.g., di-5-norbornene-2-methyl adipate, di-5-norbornene-2-methyl terephthalate; Ozone Protector 80, a product of Reichhold Chemical Co.; N-phenyl-2-naphthylamine; unsaturated vegetable oils, e.g., rapeseed oil, linseed oil, safflower oil; polymers and resins, e.g., ethylene/vinyl acetate copolymer resin, chlorinated polyethylene, chlorosulfonated polyethylene, chlorinated ethylene/methacrylic acid copolymer, polyurethanes, polypentadienes, polybutadiene, furfural-derived resins, ethylene/propylene/diene rubber, diethylene glycol ester of rosin and alpha-methylstyrene/vinyltoluene copolymer. Ozone resistance of the printing relief produced can also be improved by annealing it at elevated temperatures prior to use.

If desired, the photosensitive compositions can also contain immiscible, polymeric or nonpolymeric organic or inorganic fillers or reinforcing agents which are essentially transparent at the wavelengths used for exposure of the photosensitive material and which do not scatter actinic radiation, e.g., polystyrene, the organophilic silicas, bentonites, silica, powdered glass, colloidal carbon, as well as various types of dyes and pigments. Such materials are used in amounts varying with the desired properties of the elastomeric compositions. The fillers are useful in improving the strength of the elastomeric layer, reducing tack and, in addition, as coloring agents.

The photosensitive layer preferably contains a compatible plasticizer to lower the glass transition temperature of the binder and facilitate selective development. The plasticizer may be any of the common plasticizers compatible with the polymeric binders. Among the common plasticizers are dialkyl phthalates, alkyl phosphates, polyethylene glycol, polyethylene glycol esters, and polyethylene glycol ethers. Other useful plasticizers include oleic acid, lauric acid, etc. Polyesters are preferred plasticizers, e.g., polyethylene sebacate, etc. The plasticizer is generally present in an amount of 1 to 15% by weight based on weight of total solids of the photosensitive composition.

The photosensitive compositions of this invention can be prepared in any suitable way by mixing the ingredients, i.e., (a) the high molecular weight butadiene/acrylonitrile copolymer, (b) the compatible ethylenically unsaturated compound, and (c) the free-radical generating system. For example, flowable compositions can be made by mixing them and other desired adjuvants in any order and, if desired, with the aid of a solvent such as chlorinated hydrocarbons, e.g., chloroform, chlorobenzene, trichloroethylene and chlorotoluene; ketones, e.g., methyl ethyl ketone, diethyl ketone and methyl isobutyl ketone; aromatic hydrocarbons, e.g., benzene, toluene and xylene; and tetrahydrofuran. The above solvents can contain as diluents acetone; lower molecular weight alcohols, e.g., methyl, ethyl and propyl alcohol; and esters, e.g., methyl, ethyl and butyl acetate. The solvent can be removed later by heating the admixture or extruded layer.

Conventional milling, mixing, and solution techniques can be used in making these compositions, the particular technique varying with the differences in properties of the respective components. The homogeneous, substantially nonradiation-scattering compositions, are formed into sheets in any desired manner. For example, solvent-casting, hot pressing, calendering, or extrusion are suitable methods for preparing layers of the desired thickness.

The photosensitive elements of this invention can be made by solvent casting or by extruding, calendering or pressing at an elevated temperature of the photosensitive composition into the form of a layer or self-supporting sheet on a suitable casting wheel, belt or platen. The layer or sheet may be laminated to the surface of the flexible support described above and adhered by means of the adhesive blend described below. When a solution is used the coating is made on the adhesive-bearing support.

The thickness of the photosensitive layer is a direct function of the thickness desired in the relief image and this will depend on the subject being reproduced and the ultimate use of the relief, e.g., thick soft reliefs are useful for flexographic printing and thin hard reliefs are useful for planographic printing. In general, the thickness of the polymerizable layer will be less than about 0.250 inch, e.g, it will vary from about 0.005 to about 0.250 inch (0.0127–0.635 cm) and layers within this range of thickness will be used for the majority of the printing plates.

Between the photosensitive layer and flexible support described above is placed a layer of an adhesive blend which comprises at least two polymers taken from a group of the following four polymers:

(1) Polyester resin, a condensation polymer of ethylene glycol, terephthalic acid, isophthalic acid and azelaic acid in a molar ratio of about 6:2:1:3 have a $\overline{M}n$ of 19,000 and $\overline{M}w$ of 37,000;

(2) Polyether polyurethane resin, a crystalline, thermoplastic resin having a Brookfield viscosity of 100–1200 centipoises using 15% by weight solids in methyl ethyl ketone and a Brookfield spindle #3 at 12 rpm, and an adhesive activation temperature in the range of 54° to 63° C. The polyether polyurethane has an elongation at yield of 15%, elongation at break of 615%, modulus at 400% elongation of 600 psi (42.18 kg/cm$^2$), decrystallization temperature of about 49° C.;

(3) Polyamide resin, a translucent light amber color, Ball and Ring softening point of 132°–145° C., melt viscosity of 40 to 60 poises at 210° C., flash point greater than 299° C., percent water absorption for 1 day is 0.7, for 7 days is 1.6, tensile yield of 460 psi (32.34 kg/cm$^2$), tensile break of 450 psi (31.64 kg/cm$^2$) and elongation of 560%. (The tensile yield, tensile break and elongation are determined at 24° C. according to ASTM Procedure D-1708); and (4) Polyamide resin, a translucent light amber color, Ball and Ring softening point of 150°–160° C.; viscosity of 28–38 poises at 210° C., percent water absorption for 1 day is 1.5, for 7 days is 2.8, and

|  | −18° C. | 24° C. | 60° C. |
| --- | --- | --- | --- |
| Tensile yield, psi (kg/cm$^2$) | 980 (68.89) | 400 (28.12) | 70 (4.92) |
| Tensile break, psi (kg/cm$^2$) | 2200 (154.66) | 360 (25.31) | 50 (3.52) |
| elongation | 350 | 250 | 40 |

-continued

|     | −18° C. | 24° C. | 60° C. |
| --- | --- | --- | --- |
| (%) |  |  |  |

(The tensile yield, tensile break and elongation are determined at the stated temperatures according to ASTM Procedure D-1708).

The number average molecular weights ($\overline{Mn}$) of the resins can be determined by gel permeation chromatography (GPC) employing a known standard, e.g., polybutadiene, as known to those skilled in the art. The weight average molecular weights ($\overline{Mw}$) of the resins can be determined by using a light scattering technique using known standard samples, e.g., polystyrene, polymethacrylic acid, polymethylmethacrylate, etc., as known to those skilled in the art.

The particular polymers can be present in the adhesive blend in the following ranges based on the total weight of resin in the adhesive composition: (1) 0 to 78% by weight, (2) 0 to 78% by weight, (3) 0 to 94% by weight, and (4) 0 to 97% by weight. Preferred adhesive blends containing four, three and two resin components are set forth below wherein the percentages are by weight based on the total resin content.

Percentage ranges for the quaternary adhesive blend are:
(1) 25 to 31%, preferably 25%,
(2) 25 to 31%, preferably 25%,
(3) 25 to 19%, preferably 25%, and
(4) 25 to 19%, preferably 25%.

Percentage ranges for two tertiary adhesive blends, A and B, are:

A.

(1) 1 to 78%, preferably 1 to 65%,
(2) 1 to 78%, preferably 1 to 65%, and
(3) 1 to 94%, preferably 1 to 90%; and

B.

(1) 1 to 63%, preferably 1 to 45%,
(3) 1 to 93%, preferably 1 to 85%, and
(4) 1 to 97%, preferably 1 to 90%.

Percentage ranges for five binary adhesive blends, C to G, are:

C.

(1) 7 to 77%, preferably 15 to 50%, most preferably 30% and
(3) 93 to 23%, preferably 85 to 50%, most preferably 70%.
(This adhesive blend is particularly preferred.)

D.

(1) 3 to 60%, more preferably 5 to 30%, and
(4) 97 to 40%, more preferably 95 to 70%, E. (1) 23 to 77%, more preferably 35 to 45%, and
(2) 77 to 23%, more preferably 65 to 55%.

F.

(2) 10 to 60%, preferably 25 to 30%, and
(4) 90 to 40%, preferably 75 to 70%; and

G.

(2) 7 to 72%, preferably 15 to 50%, and
(3) 93 to 28%, preferably 85 to 50%.

The adhesive blends of this invention provide an adhesion value for the photosensitive layer to the support of at least 3 lbs/inch (53.57 kg/m) and generally much greater adhesion, e.g., in the range of 8 lbs/inch (142.86 kg/m) or more. These adhesion values are sufficient when the elements of the invention are used as printing plates, particularly flexographic printing plates.

The adhesive blends preferably contain additives such as antiblocking agents, colorants, e.g., dye, etc. Useful antiblocking agents include: preferably polyolefin particles or beads but also other hard particles or beads such as silicon dioxide, etc. Dioctyl sodium sulfosuccinate, a surfactant, can be used. A preferred polyolefin material is described in the examples. The bead size of the antiblocking agents can be greater than the thickness of the adhesive layer resulting in beads partially protruding out of the layer of the adhesive blend. Such a configuration appears to have little or no effect on the degree of adhesion. Many types of colorants or dyes are also useful in the adhesive layer. A preferred dye is Du Pont Milling Blue BL (CI Acid Blue 59). Other useful dyes include: Methylene Violet (CI Basic Violet 5), "Luxol" Fast Blue MBSN (CI Solvent Blue 38), "Pontacyl" Wool Blue BL (CI Acid Blue 59 or CI 50315), "Pontacyl" Wool Blue GL (CI Acid Blue 102 or CI 50320), Victoria Pure Blue BO (CI Basic Blue 7 or CI 42595), Rhodamine 3 GO (CI Basic Red 4), Rhodamine 6 GDN (CI Basic Red 1 or CI 45160), Fuchsine dye (CI 42510), Calcocid Green S (CI 44090) and Anthraquinone Blue 2 GA (CI Acid Blue 58).

An adhesive solution is prepared by adding the ingredients generally in the following order to the solvent with continuous stirring: polymers, polyolefin antiblocking agent, colorants. Useful solvents include mixtures, e.g., methylene chloride/ethyl acetate, methylene chloride/n-butyl acetate, methylene chloride/cyclohexanone, methylene chloride/methanol/Cellosolve ®, etc., and preferably a mixture of methylene chloride/Cellosolve ®, 90/10 parts. Additional solvent can be added to make up any weight loss. The choice of solvents is governed by the need to provide the fastest practical drying rates without blistering the coating and without leaving behind small amounts of solvent. The solvents should also have a solubilizing effect on the dyes that may be present.

The adhesive solution is then applied to the flexible support by known means, e.g., coated by use of a doctor blade or in a commercially available continuous web coater-drier to provide a dry coating weight in the range of about 80 to 500 mg/dm² preferably about 260 to 300 mg/dm². A most preferred coating weight of the adhesive layer is about 260 mg/dm². Generally, the adhesive layer has a dry thickness of 0.0008 to 0.0001 inch (0.020 to 0.025 mm). In a continuous coating the web speed can vary, e.g., 15 to 150 feet/minute (4.57 to 45.72 m/minute). The drying temperature ranges from 60° to 130° C., preferably 80°–90° C.

A preferred flexible support is flame-treated polyethylene terephthalate, 0.001 to 0.007 inch (0.025 to 0.178 mm) thick, preferably 0.005 inch (0.13 mm) in thickness. Flame-treatment of polymeric films is known. The following U.S. patents describe useful procedures and apparatus for flame treating polymeric films: Bryan U.S. Pat. No. 3,145,242, and Thompson U.S. Pat. Nos. 3,360,029 and 3,391,912 which are incorporated by reference. The fuel equivalence ratio of the combustible gas mixture, $\phi$, is 1.4 which is equal to 5 (propane flow rate)/[(oxygen flow rate)+(0.21 air flow rate)]. All flow rates are in standard cubic feet or cubic liters/minute. The web speed is 175 lineal feet/minute (53.34 m/minute).

The dried adhesive coated support can be adhered immediately to the photosensitive layer or can be stored for subsequent adherence. The adhesive-coated support can be laminated to the photosensitive layer in a press, e.g., at 140° to 160° C. at a pressure of 20,000 to 30,000 psi (1406 to 2109 kg/cm$^2$) for up to about three minutes, followed by cooling in the press to less than 60° C. Preferably the photosensitive element is prepared by calendering as described in Example 8 below. The photosensitive layer, which preferably is formed by extruding through a die, has present on the side remote from the side adjacent the adhesive layer a 0.005 inch (0.13 mm) thick polyethylene terephthalate film which subsequently acts as a protective cover sheet. Other films can be used such as polystyrene, polyethylene, polypropylene or other strippable material. There preferably is present between the photosensitive layer and the film cover sheet a thin hard, flexible, solvent-soluble layer, such as a flexible, polymeric film or layer, e.g., a polyamide or a copolymer of ethylene and vinyl acetate. The flexible polymeric film remains on the photosensitive layer after removal of the film cover sheet described above. The flexible polymer film protects for reuse an image-bearing negative or transparency superposed thereon or improves contact or alignment with the photosensitive surface. Prior to the imagewise exposure using the sources described below, the element is exposed through the support to polymerize a predetermined thickness of the photosensitive layer adjacent the adhered support. This polymerized portion of the photosensitive layer is designated a floor. The floor thickness varies with the time of exposure, exposure source, etc. The exposure is generally for 1 to 30 minutes.

Printing reliefs can be made in accordance with this invention by exposing to actinic radiation selected portions of a photosensitive layer of an element described above, for example, through a process transparency, i.e., an image-bearing transparency or stencil having areas substantially transparent to actinic radiation and of substantially uniform optical density and areas opaque to actinic radiation and of substantially uniform optical density until substantial addition-polymerization or photocrosslinking takes place. During the addition-polymerization or crosslinking, the butadiene polymer/ethylenically unsaturated compound composition is converted to the insoluble state in the radiation-exposed portions of the layer, with no significant polymerization or crosslinking taking place in the unexposed portions or areas of the layer. The unexposed portions of the layer are removed by means of a solvent for the high molecular weight butadiene polymers. The process transparency may be constructed of any suitable material including cellulose acetate film and oriented polyester film.

Actinic radiation from any source and of any type can be used in the photopolymerization process. The radiation may emanate from point sources or be in the form of parallel rays or divergent beams. By using a broad radiation source relatively close to the image-bearing transparency, the radiation passing through the clear areas of the transparency enters as divergent beams and thus irradiates a continually diverging area in the photosensitive layer underneath the clear portions of the transparency. This results in a polymeric relief having its greatest width at the bottom of the photosensitive layer, i.e., a frustum, the top surface of the relief being the dimensions of the clear area.

Inasmuch as the free-radical generating systems activatable by actinic radiation generally exhibit their maximum sensitivity in the ultraviolet range, the radiation source should furnish an effective amount of this radiation, preferably having a wavelength range between about 2500 Å and 5000 Å. Suitable sources of such radiation, in addition to sunlight, include carbon arcs, mercury-vapor arcs, fluorescent lamps with ultraviolet radiation-emitting phosphors, argon glow lamps, electron flash units and photographic flood lamps. Electron accelerators and electron beam sources through an appropriate mask may also be used. Of these, the mercury-vapor lamps, particularly the sun lamp or "black light" type, and the fluorescent sun lamps, are most suitable.

The radiation exposure time may vary from fractions of a second to minutes, depending upon the intensity and spectral energy distribution of the radiation, its distance from the composition and the nature and amount of the composition available. Customarily, a mercury vapor arc or a sunlamp is used at a distance of about 1.5 to about 60 inches (3.8 to 153 cm) from the photosensitive composition. Exposure temperatures are not particularly critical, but it is preferred to operate at about ambient temperatures or slightly higher, i.e., about 20° to about 35° C.

After exposure, the image may be developed by washing with a suitable solvent. The solvent liquid should have good solvent or swelling action on the butadiene polymer/ethylenically unsaturated compound composition and little action on the insolubilized image or upon the support or adhesive layer in the period required to remove the nonpolymerized or non-crosslinked portions. Suitable organic solvents include 2-butanone, benzene, toluene, xylene, trichloroethane, trichloroethylene, methyl chloroform, tetrachloroethylene, and solvent mixtures, e.g., tetrachloroethylene/n-butanol, etc. When the high molecular weight butadiene polymer component contains carboxyl groups, suitable solvents include aqueous base to which a water-soluble organic solvent may be added. Suitable specific solvent mixtures include sodium hydroxide/isopropyl alcohol/water, sodium carbonate/water, sodium carbonate/2-butoxyethanol/water, sodium borate/2-butoxyethanol/water, sodium silica/2-butoxyethanol/glycerol/water, sodium carbonate/2-(2-butoxyethoxy)ethanol/water and sodium hydroxide (0.5 weight percent) in 16 volume percent 2-(2-butoxyethoxy) ethanol in water, which is preferred. The particular solvent combination chosen will depend upon the carboxyl content of the photosensitive composition and the properties and amounts of the binders employed. Other aqueous solvent combinations which may be employed are described in U.S. Pat. No. 3,796,602. These aqueous base/water-soluble organic solvent combinations may be preferred in some cases because of their low cost, nonflammability and reduced toxicity.

Solvent development may be carried out at about 25° C., but best results are sometimes obtained when the solvent is warm, e.g., 30°-60° C. Development time can be varied but preferably is in the range of 5-25 minutes.

In the development step where the relief is formed, the solvent may be applied in any convenient manner, as by pouring, immersion, spraying, or roller application.

Brushing aids in the removal of the unpolymerized or uncrosslinked portions of the composition.

After liquid development the plate is dried at room temperature, optionally in hot air by a forced hot air drier or other suitable drier and is dried at room temperature to about 125° C., preferably 60° C. for one hour. The dried plate is then detackified, e.g., by treating with an aqueous hypochlorite solution, e.g., 900 parts water, 90 parts Clorox®, 10 parts conc HCl, and is dried. After post exposing for 5 to 15 minutes using the source used for the imagewise exposure the plate is ready for use.

BEST MODE FOR CARRYING OUT THE INVENTION

The best mode is illustrated in Example 8.

INDUSTRIAL APPLICABILITY

The printing reliefs prepared from the photosensitive flexographic elements of the invention can be used in all classes of printing but are most applicable to those classes of printing wherein a distinct difference of height between printing and nonprinting areas is required and particularly to the flexographic printing class wherein a resilient print area is required, e.g., for printing on deformable printing surfaces. These classes include those wherein the ink is carried by the raised portion of the relief such as in dry-offset printing, ordinary letterpress printing, the latter requiring greater height differences between printing and nonprinting areas, and those wherein the ink is carried by the recessed portions of the relief such as in intaglio printing, e.g., line and inverted halftone. The plates are also useful for multicolor printing.

The relief and printed images obtained show fidelity to the original transparency both in small detail and in overall dimensions even when the element is imagewise exposed on a cylindrical support. The reliefs have high impact strength, are tough and abrasion-resistant, and have broad ink compatibility, i.e., have good compatibility with a wide range of inks, e.g., water-based inks, hydrocarbon ink and alcohol-based inks.

EXAMPLES

The following examples illustrate the invention wherein the parts and percentages are by weight. The adhesion values in the Examples is determined by the following peel test procedure:

Peel Test Procedure

The samples are cut to size, one inch×six inches (2.54×15.24 cm). After an appropriate exposure through the support and imagewise exposure to actinic radiation are given (unless otherwise indicated) a corner of the support is picked loose from the photosensitive layer and is peeled by hand for a distance of about 1.5 inches (3.81 cm). It may be necessary to grip the peeled photosensitive layer with a pair of pliers during this operation.

A prepared sample is inserted in the jaws of an Instron® Universal Testing Instrument, Model TTC, manufactured by the Instron Engineering Company, Canton, MA, the photosensitive layer in the upper jaw, the peeled support in the lower jaw. The test is performed at 10 inches/minute (25.4 cm/minute) cross head separation rate. A tensile load cell C is used, for which, maximum allowed load is 50 lbs (22.68 kg), the initial jaw separation is ⅜ inch (0.95 cm), initial peel angle is 90° C. and the final peel angle is 45° to 60°, support to support. Stress to peel the sample is read from the recorder on the instrument and divided by 1.0 inch (2.54 cm) (sample width) to obtain the appropriate units. When the adhesive strength (adhesion) is greater than 8 lbs/inch (142.86 kg/m) the photosensitive layer breaks or tears without peeling during the test.

The polymers present in the adhesive blend are designated numerically (1), (2), (3) or (4) as set forth above.

EXAMPLE 1

An adhesive solution is prepared from the following ingredients:

| Ingredient | Amount (parts) |
| --- | --- |
| Polyamide resin (3), Lot No. OF 5237[1] | 63.1 |
| Polyester resin (1),[2] | 27.0 |
| Polyolefin[3] | 9.8 |
| Du Pont Milling Blue BL dye, C.I. Acid Blue 59 | 0.1 |

[1] The polyamide resin, Macromelt® 6238, a product of Henkel Adhesives Company, a division of Henkel Corp., 4620 West 77th Street, Minneapolis MN is a translucent light amber color, has a Ball and Ring Softening Point of 132–145° C.; melt viscosity of 40 to 60 poises at 210° C.; flash point greater than 299° C.; percent water absorption, 1 day is 0.7, 7 days is 1.6; tensile yield of 460 psi (32.34 kg/cm²); tensile break of 450 psi (31.64 kg/cm²) and elongation of 560%. (The tensile yield, tensile break and elongation are determined at 24° C. according to ASTM Procedure D-1708).
[2] The polyester resin is the reaction product of ethylene glycol, terephthalic acid, isophthalic acid and azelaic acid (molar ratio 6:2:1:3) having a Mn of 19,000 and Mw of 37,000.
[3] The polyolefin, Vestofine® SF-616, a product of Dura Commodities Corp., 111 Calvert Street, Harrison, New York, is snow white in color, has a molecular weight of about 1,6000, a density at 20° C. of about 0.96, penetration hardness at 25° C. of 0.5 to 1.0, a melting point of about 118–128° C., particle size: about 85% 10 microns or below, about 15% 10–20 microns.

The above ingredients are added in order to a 90/10 parts mixture of methylene chloride/Cellosolve® to give a solution of about 16% solids. The polyolefin beads do not dissolve. The mixture is stirred continuously during and after the addition of the ingredients to effect solution. Any weight loss during mixing is made up by addition of methylene chloride.

The adhesive solution is applied to the flame-treated surface of a polyethylene terephthalate film support, 0.005 inch (~0.13 mm) in thickness using a continuous web coater-drier to provide a dry coating weight of about 260 mg/dm². The web speed is 45 feet/minute (~13.72 m/minute) and the drying temperature is 86° C. (205° F.).

The adhesive-coated polyethylene terephthalate support is placed adhesive side up in a steel platen dammed to a thickness of (0.080 inch (2.03 mm), the thickness of the finished printing plate. The adhesive-coated support and platen are placed on a press and an extruded sheet, 0.090 inch (about 2.29 mm) thick, of a photopolymerizable composition on a 0.005 inch (0.13 mm) thick polyethylene terephthalate support is placed thereon with the support side up, and is covered with a steel plate. The extruded sheet of the photopolymerizable composition is prepared from the following ingredients which are blended and the blend is extruded at 170° C. through a die.

| Ingredient | Amount (parts) |
| --- | --- |
| Acrylonitrile (27)/butadiene (70)/acrylic acid (3), high molecular weight, (average Mooney Viscosity is 45.0, Hycar® 1472x26 BF Goodrich Chemical Co. | 81.59 |

-continued

| Ingredient | Amount (parts) |
|---|---|
| Hexamethylene diacrylate | 10.0 |
| Polyethylenesebacate[4] | 5.0 |
| Dibutyltin-S,S'-bis-isooctyl-mercapto-acetate | 2.0 |
| 2-Phenyl-2,2-dimethoxyaceto-phenone | 1.25 |
| 2,6-Di-t-butyl-4-methylphenol | 0.10 |
| 1,4,4-Trimethyl-2,3-diazabicyclo-(3.2.2)-non-2-ene-2,3-dioxide | 0.05 |
| Du Pont Milling Blue BL dye, C.I. Acid Blue 59 (10% dispersion in ethylene glycol) | 0.01 (dry) |

[4]Paraplex ® G-30, a low molecular weight polyester resin manufactured by Rohm and Haas, Philadelphia, PA.

The temperature is raised and pressure is gradually applied which spreads the photopolymerizable sheet throughout the dammed area of the platen. After the sheet is evenly distributed the temperature is raised to 160° C. and pressure in the range of 20,000 to 30,000 psi (1406 to 2109 kg/cm$^2$) is applied and held for three minutes. The assembly is cooled in the press to less than 60° C. by flowing water through the press platens. The laminated element formed is removed from the press and is placed support side up under a blank of black fluorescent tubes, such as Sylvania's BL lamps. The element is exposed for 4 minutes through the support to polymerize a predetermined thickness of the photopolymerizable layer adjacent the adhered support. The polymerized portion of the element is designated a floor.

The element is then placed in a Cyrel ®3040 Exposure Unit (registered trademark of E. I. du Pont de Nemours and Company) fitted with Sylvania BL-VHO fluorescent lamps. The photopolymerizable surface is covered with an image-bearing transparency (negative), and the element is exposed for 15 minutes while under vacuum. The duration of exposure is a function of the photopolymer sheet thickness, thickness of the polymerized floor and the type of image-bearing transparency used.

After exposure the transparency is removed, and the exposed element is placed in a rotary drum-brush type Cyrel ®3040 Processor. The unpolymerized areas of the element are removed in the processor by washing for 15 minutes with 0.5 weight percent sodium hydroxide in 16 volume percent 2-(2-butoxyethoxy)ethanol in water. A 0.035 inch (0.89 mm) relief image is obtained. The developed element (printing plate) is placed in a forced hot air drier or other suitable drier and is dried at 60° C. for one hour. The dry plate is then detackified for 1 to 3 minutes in a solution of aqueous hypochlorite (900 parts water, 90 parts Clorox ®, 10 parts conc. HCl) and is dried again. The dry plate is post-exposed in air for 10 minutes using the same exposure source used for the imagewise exposure described above. The plate has a Shore ®A2 hardness in the range of 56–60 (ASTM testing method D2240).

The plate can now be mounted on a flexographic press cylinder with commercially available double sided adhesive tape and printed with standard flexographic ink. The print quality is equal to or better than that produced with rubber plates printed in the same manner. The adhesion of the photopolymer layer to the support is greater than 8 lbs/inch (142.86 kg/m).

EXAMPLE 2

An adhesive solution is prepared as described in Example 1. This solution is applied to the flat surface of a polyimide flexible film support, 0.005 inch (0.127 mm), thick, Kapton ® polyimide film, manufactured by E. I. du Pont de Nemours and Company, Wilmington, DE. A measured quantity of the adhesive solution is poured onto the support surface and is distributed by means of a 0.006 inch (0.15 mm) doctor knife. The adhesive coating is air dried.

An extruded photosensitive layer as described in Example 1 is pressed onto the adhesive-coated support by the procedure described in Example 1. The final press temperature is 160° C. and the pressure is about 25,000 psi (1757.5 kg/cm$^2$). The pressed plate is removed from the press after cooling as described in Example 1. The plate is cut into a 1.0 inch×6.0 inches (2.54 cm×15.24 cm) wide strip and is overall exposed for 3 minutes from the support side and 30 minutes from the photosensitive side in the exposure device described in Example 1. Attempts to peel the photosensitive layer failed, the photosensitive layer failed cohesively indicating an adhesion value of greater than 8.0 lbs/inch (142.86 kg/m).

EXAMPLE 3

Example 2 is repeated except that the adhesive solution is prepared from the following ingredients:

| Ingredient | Amount (g) |
|---|---|
| Polyester resin described in Example 1 | 10,772.0 |
| Polyether polyurethane resin,[1] | 16,204.0 |
| Polyolefin described in Example 1 | 2,996.0 |
| Du Pont Milling Blue BL dye, C.I. Acid Blue 59 | 28.0 |

[1]The polyether polyurethane resin, Q-Thane ® P250-1, a product of K. J. Quinn Company, Malden, MA, is a crystalline, thermoplastic resin having a Brookfield viscosity of 100–1200 centipoises using 15% solids in methyl ethyl ketone and a Brookfield spindle #3 at 12 rpm, and an adhesive activation temperature in the range of 54 to 63° C., and a decrystallization temperature of about 49° C.

As in Example 2 the photosensitive layer failed cohesively indicating an adhesion value of greater than 8.0 lbs/inch (142.86 kg/m).

EXAMPLES 4 TO 6

Several adhesive solutions are prepared as described in Example 1. A solution is applied to the flat surface of a flexible support set forth below in Table 1. A measured quantity of the adhesive solution is poured onto the support surface and is distributed with a No. 65 wire wound stainless steel rod. The adhesive coating is air dried.

An extruded photosensitive layer as described in Example 2 is pressed onto the adhesive-coated support by the procedure described in Example 2. The pressed plate is removed from the press after cooling as described in Example 1. The plate is cut as described in Example 2 and is exposed overall for 25 minutes in the exposure device described in Example 1. The adhesion values determined are set forth in Table 1.

| Example | Support | Adhesion Value lbs/inch (kg/m) |
|---|---|---|
| 4 | Aluminum, flexible Alcoa 3003 Alloy, 0.010–0.0115 inch | up to 4.5 (80.36) |

-continued

| Example | Support | Adhesion Value lbs/inch (kg/m) |
|---|---|---|
| | (0.25–0.29 mm) | |
| 5 | Tin plated steel (shiny) 0.008 to 0.010 inch (0.20 to 0.25 mm) | up to 6.0 (107.14) |
| 6 | Tin plated steel (dull) 0.008 to 0.010 inch (0.20 to 0.25 mm) | up to 6.0 (107.14) |

EXAMPLE 7

Adhesive solutions are prepared as described in Example 1 from the following ingredients:

| Ingredients | Amount |
|---|---|
| Resins* | (see Table 2 for type and percentage based on total weight of resins) |
| Antiblocking agent described in Example 1 | 9.2** |
| Dye described in Example 1 | 0.1** |

*The 2 to 4 resins are present in excess of 90% by weight of solids in adhesive solution.
**Based on the total weight of solids in the adhesive solution.

Samples 7, 25–28, and 40–70 are coated as described in Example 1 with the approximate coating weights indicated. Samples 1 to 6, 8–24, 29–39, and 71 to 87 are coated as described in Example 2 with the approximate coating weights indicated. The supports on which the adhesive solutions are coated are:

Samples 1 to 40, 42–49, 52–67, 69, and 74–87, flame-treated polyethylene terephthalate.

Samples 41, 68, 70, and 71 to 73, untreated polyethylene terephthalate described in Example 1.

Sample 50, 51, election discharge treated polyethylene terephthalate [1.0 to 6.0 joules/inch (0.39 to 2.36 joules/cm)].

The photosensitive layers described in Example 1 are laminated to the adhesive-coated supports set forth in Table 2 by the procedure as described in Example 1. The laminated elements after being removed from the press are treated as set forth below. The back exposure source, exposure unit, processor, and drier are described in Example 1.

A. Exposure through support is 4 minutes; imagewise exposure is 15 minutes; solvent washout as described in Example 1 is 10 minutes; drying is 60 minutes; after treatment as described in Example 1; and post exposure in air is 10 minutes: Samples 1 to 7.

B. Exposure through support is 4 minutes; imagewise exposure is 15 minutes; solvent washout, none; drying, none; after treatment as described in Example 1, none; post exposure in air is 15 minutes: Samples 8 to 13.

C. Exposure through support is 4 minutes; imagewise exposure is 30 minutes; solvent washout, drying, after treatment, post exposure, all none: Samples 14 to 34.

D. There is no treatment for samples 35 to 39, Samples 44 to 77 and Samples 82 to 85 which are tested after the laminated elements are removed from the press.

E. Similar treatment to C above except the exposure through the support is 3 minutes: Samples 40 to 43.

F. Similar treatment to C above except that the imagewise exposure is 25 minutes: Samples 78 to 81.

G. Exposure through support is 4 minutes; imagewise exposure is 15 minutes; solvent washout, drying, after treatment, all none; post exposure in air is 10 minutes: Samples 86 and 87.

TABLE 2

| Sample | Resins | Soln. (% solids) | Weight (mg/dm$^2$) | Coating Adhesion (lbs/in.) |
|---|---|---|---|---|
| 1 | 1(30), 2(70) | 16.0 | 259–303 | >8.0 |
| 2 | 2(75), 4(25) | 15.2 | 250–300 | 1.5 |
| 3 | 2(50), 4(50) | 15.2 | 250–300 | 2.5–4.0 |
| 4 | 2(25), 4(75) | 15.2 | 250–300 | >8.0 |
| 5 | 2(75), 3(25) | 15.2 | 250–300 | 1.5 |
| 6 | 2(25), 3(75) | 15.2 | 250–300 | >8.0 |
| 7 | 3(50), 4(50) | 16.0 | 283–293 | >8.0 |
| 8 | 1(20), 3(80) | 13.0 | 250–300 | >8.0 |
| 9 | 1(30), 3(70) | 14.5 | 250–300 | >8.0 |
| 10[1] | 1(30), 3(70) | 14.5 | 250–300 | >8.0 |
| 11 | 1(40), 3(60) | 14.5 | 250–300 | >8.0 |
| 12 | 1(50), 3(50) | 14.5 | 250–300 | 5.0–6.0 |
| 13 | 1(75), 3(25) | 14.5 | 250–300 | 3.2–4.0 |
| 14 | 1(5), 4(95) | 13.0 | 250–300 | >8.0 |
| 15 | 1(10), 4(90) | 13.0 | 250–300 | >8.0 |
| 16 | 1(15), 4(85) | 13.0 | 250–300 | >8.0 |
| 17 | 1(20), 4(80) | 13.0 | 250–300 | >8.0 |
| 18 | 1(20), 3(80) | 12.5 | 250–300 | >8.0 |
| 19 | 1(30), 3(70) | 12.5 | 250–300 | >8.0 |
| 20 | 1(40), 3(60) | 12.5 | 250–300 | >8.0 |
| 21 | 1(50), 3(50) | 12.5 | 250–300 | >8.0 |
| 22 | 3(25), 4(75) | 13.0 | 250–300 | >8.0 |
| 23 | 3(50), 4(50) | 13.0 | 250–300 | >8.0 |
| 24 | 3(75), 4(25) | 13.0 | 250–300 | >8.0 |
| 25 | 1(30), 3(70) | 13.0 | 250–300 | >8.0 |
| 26 | 3(50), 4(50) | 13.0 | 250–300 | >8.0 |
| 27 | 2(25), 3(75) | 16.0 | 250–300 | >8.0 |
| 28 | 2(25), 4(75) | 16.0 | 250–300 | >8.0 |
| 29 | 1(15), 3(85) | 16.0 | 250–300 | >8.0 |
| 30 | 1(30), 3(70) | 16.0 | 250–300 | >8.0 |
| 31 | 1(60), 3(40) | 16.0 | 250–300 | 3.0 to 3.5 |
| 32 | 1(15), 3(85) | 16.0 | 250–300 | >8.0 |
| 33 | 1(30), 3(70) | 16.00 | 250–300 | >8.0 |
| 34 | 1(60), 3(40) | 16.0 | 250–300 | 3.5 to 5.0 |
| 35 | 1(20), 2(80) | 16.0 | 250–300 | about 4.0 |
| 36 | 1(30), 2(70) | 16.0 | 250–300 | 4.5 |
| 37 | 1(35), 2(65) | 10.0 | 250–300 | 4.5 |
| 38 | 1(40), 2(60) | 10.0 | 250–300 | 5.0 |
| 39 | 1(50), 2(50) | 10.0 | 250–300 | 4.0 |
| 40 | 1(40), 2(60) | 14.8 | 331 | 4.6 |
| 41 | 1(40), 2(60) | 14.8 | 165 | 3.4 |
| 42 | 1(40), 2(60) | 15.0 | 173 | 3.8 |
| 43 | 1(40), 2(60) | 15.0 | 339 | 5.4 |
| 44 | 1(40), 2(60) | 15.0 | 393 | 5.5 |
| 45 | 1(40), 2(60) | 15.0 | 336 | 2.2 to 4.8 |
| 46 | 1(40), 2(60) | 15.0 | 347 | 5.0 |
| 47 | 1(40), 2(60) | 15.0 | 352 | 4.9 |
| 48 | 1(40), 2(60) | 15.0 | 352 | 5.5 |
| 49 | 1(40), 2(60) | 15.0 | 344 | 4.0 |
| 50 | 1(40), 2(60) | 15.0 | 331 | 4.5 |
| 51 | 1(40), 2(60) | 15.0 | 419 | 4.5 |
| 52 | 1(40), 2(60) | 15.0 | 384 | 5.5 |
| 53 | 1(40), 2(60) | 15.0 | 201 | >8.0 |
| 54 | 1(40), 2(60) | 15.0 | 192 | 4.0 |
| 55 | 1(40), 2(60) | 15.0 | 80 | 5.0 |
| 56 | 1(40), 2(60) | 15.0 | 372 | 6.0 |
| 57 | 1(40), 2(60) | 15.0 | 195 | 4.2 |
| 58 | 1(40), 2(60) | 15.0 | 128 | 5.0 |
| 59 | 1(40), 2(60) | 15.0 | 91 | 4.5 |
| 60 | 1(40), 2(60) | 15.0 | 270 | >5.0 to >7.5 |
| 61 | 1(40), 2(60) | 15.0 | 284 | 5.2 |
| 62 | 1(40), 2(60) | 15.0 | 302 | 5.0 |
| 63 | 1(40), 2(60) | 15.0 | 299 | >7.3 |
| 64 | 1(40), 2(60) | 15.0 | 264 | 5.0 |
| 65 | 1(40), 2(60) | 15.0 | 153 | 6.0 |
| 66 | 1(40), 2(60) | 15.0 | 292 | 5.0 |
| 67 | 1(40), 2(60) | 15.0 | 291 | Fresh 4.2 Aged 4.6[2] |
| 68 | 1(50), 2(50) | 15.0 | 328 | Fresh 4.5 Aged 5.0[2] |
| 69 | 1(50), 2(50) | 15.0 | 316 | Fresh 4.4 Aged 4.8[2] |
| 70 | 1(40), 2(60) | 15.0 | 292 | Fresh 5.0 |

TABLE 2-continued

| Sample | Resins | Soln. (% solids) | Weight (mg/dm$^2$) | Coating Adhesion (lbs/in.) |
|---|---|---|---|---|
| | | | | Aged 5.5$^2$ |
| 71 | 2(67), 4(33) | 15.0 | 250–300 | <1.0 |
| 72 | 2(75), 4(25) | 15.0 | 250–300 | <1.0 |
| 73 | 1(40), 3(60) | 15.0 | 250–300 | 6.5 to >8.0 |
| 74 | 2(15), 3(85) | 15.0 | 250–300 | >8.0 |
| 75 | 2(70), 3(30) | 15.0 | 250–300 | 6.5 |
| 76 | 2(50), 3(50) | 15.0 | 250–300 | >8.0 |
| 77 | 1(10), 2(90) | 15.0 | 250–300 | 2.0 |
| 78 | 1(33), 3(33), 4(33) | 15.0 | 250–300 | >8.0 |
| 79 | 1(17), 3(66), 4(17) | 15.0 | 250–300 | >8.0 |
| 80 | 1(17), 3(17), 4(66) | 15.0 | 250–300 | >8.0 |
| 81 | 1(66), 3(17), 4(17) | 15.0 | 250–300 | 2.5 |
| 82 | 1(33), 2(33), 3(33) | 15.0 | 250–300 | 5.8 |
| 83 | 1(17), 2(66), 3(17) | 15.0 | 250–300 | 6.0 |
| 84 | 1(17), 2(17), 3(66) | 15.0 | 250–300 | >8.0 |
| 85 | 1(66), 2(17), 3(17) | 15.0 | 250–300 | 3.5 |
| 86 | 1(25), 2(25), 3(25), 4(25) | 12.7 | 250–300 | >8.0 |
| 87 | 1(33), 2(33), 3(17), 4(17) | 12.7 | 250–300 | 1.0 |

[1] The antiblocking agent Eftofine ®, a product of Dura Commodities Corp., 111 Calvert Street, Harrison, NY, is a synthetic hydrocarbon wax; melting point 235–245° F. (113–118° C.), congealing point ASTM 0938 is 206 to 210° F. (97–99° C.); needle penetration at 77° F. (25° C.) ASTM D1321 is 0.9 to 1.4 (mm/10); average particle size is 2 microns; maximum particle size for 99% of weight is 10 microns.
[2] Aged values are determined after heating in a drying oven at 50° C. for two weeks.

EXAMPLE 8

A flexographic printing plate is prepared using the photopolymerizable composition and adhesive coated support described in Example 1, and a 0.005 inch (0.127 mm) thick polyethylene terephthalate cover sheet bearing a layer of a polyamide resin having a dry thickness of 0.00017 inch (0.004 mm). The cover sheet bearing the polyamide layer is prepared by coating the polyethylene terephthalate film with the following solution using an extrusion die coater:

| Ingredient | Amount (%) |
|---|---|
| Methylene chloride | 81.0 |
| Methanol | 2.0 |
| N—methyl pyrrolidone | 10.0 |
| Polyamide resin[1] | 7.0 |

[1] The polyamide resin, Macromelt ® 6900, a product of Henkel Adhesives Company, a division of Henkel Corporation, 4620 West 77th Street, Minneapolis, MN is essentially colorless, has a Ball and Ring Softening Point, of 266–302° F.; melt index at 347° F. of 5–15 g/10 minutes; flash point 570° F.; percent water absorption, 1 day is 0.2, 7 days is 0.5; tensile yield of 1,200 psi; tensile break of 3,500 psi; and elongation of 540%. The tensile yield, tensile break and elongation are determined at 24° C. according to ASTM Procedure D-1708).

The ingredients of the photopolymerizable composition are fed into a twin screw extruder, the binder component through the solids input port and the remaining blended components through the liquid input port. The extruder performs the functions of melting, mixing, devolatilizing and filtering the photopolymerizable composition before delivery at 164°–166° C. to the extrusion die. The extruded photopolymerizable composition enters the rotating bank in a two-roll calender and is calendered between the adhesive side of the coated support and the polyamide layer side of the cover sheet described above. The calender nip can be adjusted to produce photopolymerizable layers over a wide range of thicknesses, e.g., 0.112 inch (~2.85 mm) thick.

The photopolymerizable element having a photopolymerizable layer thickness of 0.112 inch (~2.85 mm) is cooled with blown air and is passed under a bank of black light fluorescent tubes, such as Sylvania's BL lamps, placed transverse to the path of movement, continually exposing the element through its support to polymerize a predetermined thickness of the photopolymerizable layer adjacent the support. The element is cut to convenient lengths, e.g., 40 inches (101.60 cm).

The photopolymerizable element is placed in an exposure unit, as described below, and is given an overall exposure in air through the support for a predetermined length of time (for example, a 0.112-inch (~2.85 mm) thick photopolymerizable layer requiring the polymerization of an 0.080 inch (2.03 mm) portion of the layer is exposed for about 3 minutes depending on lamp intensity).

The polyethylene terephthalate film on the surface of the polyamide layer is stripped therefrom. The polyamide layer remains adhered to the photopolymerizable layer. The hard, flexible smooth polyamide surface is covered with an image-bearing transparency, and the photopolymerizable layer is imagewise exposed for 5 minutes under vacuum in a Cyrel ®3040 Exposure Unit (registered trademark of E. I. du Pont de Nemours and Company) fitted with Sylvania VL-VHO fluorescent lamps.

After exposure the transparency is removed, and the exposed element is placed in a rotary drum-brush type Cyrel ®3040 Processor. The unpolymerized areas of the element are removed in the processor by washing with 0.5 weight percent NaOH in 16 volume percent 2-(2-butoxyethoxy)ethanol in water. The developed element (printing plate) is placed in a forced hot air drier or other suitable drier and is dried at 60° C. until the plate attains its original thickness. The dry plate is then detackified for 1 to 3 minutes in a solution of aqueous acidic hypochlorite (900 parts water, 90 parts Clorox ®, 10 parts conc. HCl). The plate can either be left wet or dried again. The plate is then post-exposed to air for 10 minutes using the same exposure source used for the imagewise exposure described above. The printing plate has a Shore ®A2 hardness in the range of 56–60 (ASTM testing method D2240).

The printing plate can be used for printing as described in Example 1 with comparable results being achieved. The adhesion of the photopolymer layer to the support is greater than 8 lbs./inch (142.86 kg/m).

EXAMPLE 9

In this example control resin adhesive compositions are prepared individually and in combination (blends) and are tested for adhesive strength (adhesion) as described above in the Peel Test Procedure preceding the examples. The adhesion values determined for the single component adhesive compositions, 1, 2, 3 and 4, are used to calculate the expected adhesion values of specific adhesive blends of the invention, e.g., $\frac{1}{2}$, $\frac{1}{3}$, $\frac{1}{4}$, $\frac{2}{3}$, etc., as shown in Table 3 below. The formula used for the calculation is: adhesion $= n_1F_1 + n_2F_2 + n_3F_3 + n_4F_4$, wherein $n_1$, $n_2$, $n_3$ and $n_4$ are the decimal weight fractions for the individual resins 1 to 4 in the specific blend, and $F_1$, $F_2$, $F_3$ and $F_4$ are the observed adhesion values for the respective single resin adhesive.

The control resin adhesive compositions are prepared as follows:

| Resin Adhesive Composition 1 (g) | |
|---|---|
| Polyester resin | 1109 |
| Methylene chloride | 3786 |

| | |
|---|---|
| -continued | |
| Polyolefine beads as described in Example 1 | 110 |
| Polisocyanate adduct of trimethylolpropane triacrylate and toluene diisocyanate | 28 |
| Resin Adhesive Composition 2 (g) | |
| Polyether polyurethane resin | 195.0 |
| Methylene chloride | 1660.0 |
| Cellosolve ® | 145.0 |
| Di-2-ethylhexyl sodium sulfosuccinate | 2.1 |
| Du Pont Milling Blue BL dye C.I. Acid Blue 59 | 0.2 |

Resin adhesive compositions 1 and 2 are applied to a flame-treated polyethylene terephthalate film support as described in Example 1. The coating thicknesses are about 0.0009 inch (0.023 mm).

| | |
|---|---|
| Resin Adhesive Composition 3 (g) | |
| Polyamide resin | 150 |
| Methylene chloride | 850 |
| Resin Adhesive Composition 4 (g) | |
| Polyamide resin | 130 |
| Methylene chloride | 870 |

Resin adhesive compositions 3 and 4 are applied to a polyimide flexible film support as described in Example 2. The coating thicknesses are approximately the same as for resin adhesive compositions 1 and 2.

The resin adhesive-coated supports are combined with an extruded sheet of the photopolymerizable composition as described in Example 1. The adhesion values of the samples are determined as described in the Peel Test Procedure after exposure through the support for 4 minutes and an overall exposure for 30 minutes.

The specific resin blend adhesive compositions are prepared as described in Example 1 using the ingredients set forth in Table 3 below. The resin blend adhesive-coated supports are combined with an extruded sheet of the photopolymerizable composition as described in Example 1. The adhesion values of the samples are determined as described in the Peel Test Procedure after exposure through the support for 4 minutes and an overall exposure for 30 minutes.

Adhesion values for the control resin adhesive compositions are variable. For example, on aging over a four-month period the adhesion values for resin adhesive compositions 3 and 4 decrease to 1.5 lbs/inch from initially greater than 8 lbs/inch. The 1.5 lbs/inch is taken as the adhesion value for resin adhesive compositions 3 and 4 in Table 3. Resin adhesive compositions 1 and 2 show a variable loss in adhesion values which range from 1.8 to 6.5 lbs/inch for resin adhesive composition 1 and 1.5 to 6.5 lbs/inch for resin adhesive composition 2. The adhesion ranges set forth in Table 3 are determined by testing freshly prepared samples as well as some samples aged for up to four months.

TABLE 3

| Sample | Adhesive Blend Composition (parts) | Resin Adhesive Compositions Adhesion (lb/in) | | | | | Improvement Determd over | |
|---|---|---|---|---|---|---|---|---|
| | | 1 | 2 | 3 | 4 | Calc | Blend Determd | Calculated (lb/in) |
| 1 | 1(45)/2(55) | 1.8–6.5 | 1.5–6.0 | — | — | 1.6–6.2 | >8.0 | >1.8–>6.4 |
| 2 | 1(30)/3(70) | 1.8–6.5 | — | 1.5 | — | 1.6–3.0 | >8.0 | >5.0–>6.4 |
| 3 | 1(5) (4) (95) | 1.8–6.5 | — | — | 1.5 | 1.5–1.8 | >8.0 | >6.2–>6.5 |
| 4 | 2(70)/3(30) | — | 1.5–6.0 | 1.5 | — | 1.5–4.6 | 6.5 | 1.9–4.0 |
| 5 | 2(30)/4(70) | — | 1.5–6.0 | — | 1.5 | 1.5–2.8 | >8.0 | >5.2–>6.5 |
| 6 | 3(25)/4(70) | — | — | 1.5 | 1.5 | 1.5 | >8.0 | >6.5 |
| 7 | 1(66)/2(17)/3(17) | 1.8–6.5 | 1.5–6.0 | 1.5 | — | 1.7–5.6 | 3.5 | −2.1–1.8 |
| 8 | 1(17)/2(17)/3(66) | 1.8–6.5 | 1.5–6.0 | 1.5 | — | 1.6–5.3 | >8.0 | >2.7–>6.4 |
| 9 | 1(66)/3(17)/4(17) | 1.8–6.5 | — | 1.5 | 1.5 | 1.7–4.8 | 2.5 | −2.3–0.8* |
| 10 | 1(17)/3(66)/4(17) | 1.8–6.5 | — | 1.5 | 1.5 | 1.6–2.9 | >8.0 | >5.1–>6.4 |
| 11 | 1(25)/2(25)/3(25)/4(25) | 1.8–6.5 | 1.5–6.0 | 1.5 | 1.5 | 1.6–3.9 | >8.0 | >4.1–>6.4 |
| 12 | 1(33)/2(33)/3(17)/4(17) | 1.8–6.5 | 1.5–6.0 | 1.5 | 1.5 | 1.6–4.9 | 1.0 | −3.6–(−)0.6* |

*Adhesive blend composition is outside scope of invention

We claim:

1. A photosensitive flexographic element which consists essentially of
   (A) a flexible support,
   (B) a layer of a photosensitive, elastomeric composition which consists essentially of, based on the total weight of composition
      (1) 55 to 90% by weight of a high molecular weight butadiene/acrylonitrile copolymer having a number average molecular weight of 20,000 to 75,000, an acrylonitrile content of 10 to 50% by weight and a carboxyl content of 0 to 15% by weight,
      (2) 2 to 40% by weight of a nongaseous, ethylenically unsaturated compound containing at least one terminal ethylenic group, said compound being capable of forming a highr polymer by free-radical initiated, chain-propagating addition polymerization and being compatible with polymer (1);
      (3) 0.001 to 10% by weight of an organic, radiation-sensitive, free-radical generating system, activatable by actinic radiation which initiates polymerization of the unsaturated compound; and, optionally
      (4) thermal addition polymerization inhibitor,
      (5) antioxidant,
      (6) antiozonant,
      (7) immiscible, polymeric or nonpolymeric organic or inorganic fillers or reinforcing agents which are essentially transparent at the wavelengths used for exposure, and
      (8) compatible plasticizer;
   (C) optionally a thin, hard flexible solvent soluble layer, and
   (D) optionally a removable cover sheet; and between layers (A) and (B) a layer of an adhesive composition which provides an adhesion value for the photosensitive layer (B) to the support (A) of at least 3 lbs/inch (53.57 kg/m) and consists essentially of a blend of at least two polymers taken from the group consisting of (i) polyester resin which is a condensation polymer of ethylene glycol, terephthalic acid, isophthalic acid and azelaic acid in a molar ratio of about 6:2:1:3 the resin having a number average molecular weight of about 19,000 and a weight average molecular weight of about 37,000, 0 to 78% by weight based on the total weight of resin in the adhesive composition;

(ii) polyurethane resin which is a crystalline, thermoplastic resin having a Brookfield viscosity of 100–1200 using 5% by weight solids in methyl ethyl ketone and a Brookfield spindle #3 at 12 rpm, and an adhesive activation temperature in the range of 54° to 63° C., 0 to 78% by weight based on the total weight of resin in the adhesive composition, (iii) polyamide which is a thermoplastic dimer acid polyamide resin having a Ball and Ring softening point of 132°–145° C., a viscosity at 210° C. of 40 to 60 poises, % elongation determined by ASTM D-1708 of 130 at −18° C., 560 at 24° C. and 100 at 60° C., tensile break determined by ASTM D-1708 of 4000 psi at −18° C., 450 psi at 24° C. and 170 psi at 60° C., 0 to 94% by weight based on the total weight of resin in the adhesive composition, and (iv) polyamide which is a thermoplastic dimer acid polyamide resin having a Ball and Ring softening point of 150°–160° C., a viscosity at 210° C. of 28 to 38 poises, % elongation determined by ASTM D-1708 of 350 at −18° C., 250 at 24° C. and 40 at 60° C., tensile break determined by ASTM D-1708 of 2200 psi at −18° C., 360 psi at 24° C. and 50 psi at 60° C., 0 to 97% by weight based on the total weight of resin in the adhesive composition with the proviso that when a blend of two polymers is present in the adhesive composition the percentage ranges are for the blend:

(i) 23% to 77% and (ii) 77% to 23%,
(i) 7% to 77% and (iii) 93% to 23%,
(i) 3% to 70% and (iv) 97% to 30%,
(ii) 7% to 72% and (iii) 93% to 28%,
(ii) 10% to 60% and (iv) 90% to 40%, and
(iii) 25 to 75% and (iv) 75% to 25%.

2. A flexographic element according to claim 1 wherein the adhesive blend composition consists essentially of 25 to 31% by weight polyester resin (i), 25 to 31% by weight polyether polyurethane resin (ii), 25 to 19% by weight polyamide resin (iii) and 25 to 19% by weight polyamide resin (iv), the percentage based on the total weight of resin in the adhesive composition.

3. A flexographic element according to claim 1 wherein the adhesive composition consists essentially of 1 to 78% by weight polyester resin (i), 1 to 78% by weight polyether polyurethane resin (ii), and 1 to 94% by weight polyamide resin (iii), the percentages based on the total weight of resin in the adhesive composition.

4. A flexographic element according to claim 1 wherein the adhesive composition consists essentially of 1 to 63% by weight polyester resin (i), 1 to 93% by weight polyamide resin (iii) and 1 to 97% by weight polyamide resin (iv), the percentages based on the total weight of resin in the adhesive composition.

5. A flexographic element according to claim 1 wherein the adhesive composition consists essentially of 20 to 50% by weight polyester resin (i), 80 to 50% by weight polyamide resin (iii), the percentages based on the total weight of resin in the adhesive composition.

6. A flexographic element according to claim 1 wherein the adhesive blend composition consists essentially of 3 to 70% by weight polyester resin (i), 97 to 30% by weight polyamide resin (iv), the percentages based on the total weight of resin in the adhesive composition.

7. A flexographic element according to claim 1 wherein the adhesive blend composition consists essentially of 25 to 75% by weight polyester resin (i), 75 to 25% by weight polyether polyurethane resin (ii), the percentages based on the total weight of resin in the adhesive composition.

8. A flexographic element according to claim 1 wherein the adhesive composition contains a colorant.

9. A flexographic element according to claim 1 wherein the adhesive composition contains an anti-blocking agent.

10. A flexographic element according to claim 9 wherein the antiblocking agent is particles of a tough, hard polyolefin melting in the range of about 120° to 128° C. and having a molecular weight of about 1,600.

11. A flexographic element according to claim 1 wherein the flexible support is a flame-treated polyethylene terephthalate film.

12. A flexographic element according to claim 1 wherein the flexible support is aluminum.

13. A flexographic element according to claim 1 wherein the flexible support is a polyimide film.

14. A flexographic element according to claim 1 wherein the flexible support is tin-plated steel.

15. A flexographic element according to claim 1 wherein the photosensitive layer is 0.005 to 0.250 inch in thickness.

16. A flexographic element according to claim 1 wherein the photosensitive, elastomeric composition contains a plasticizer.

17. A flexographic element according to claim 16 wherein the plasticizer is polyethylenesebacate.

18. A flexographic element according to claim 1 wherein on layer (B) is a thin, hard flexible solvent soluble layer (C).

19. A flexographic element according to claim 18 wherein on layer (C) is a removable cover sheet (D).

* * * * *